United States Patent [19]
Heinz et al.

[11] 4,093,781
[45] June 6, 1978

[54] EPITAXIAL, SODIUM-SUBSTITUTED LITHIUM FERRITE FILMS

[75] Inventors: David M. Heinz, Orange; Eugene C. Whitcomb, Mission Viejo, both of Calif.

[73] Assignee: Rockwell International Corporation, El Segundo, Calif.

[21] Appl. No.: 580,641

[22] Filed: May 27, 1975

[51] Int. Cl.² ............................................. B01J 17/36
[52] U.S. Cl. .................................. 428/539; 156/605; 156/621; 252/62; 252/56; 252/62.6; 252/62.61; 423/594; 423/596; 427/128; 428/900; 365/80
[58] Field of Search ............................ 423/594, 596; 252/62.51, 62.56, 62.6, 62.64, 62.61; 428/900, 539, 1; 427/128; 23/DIG. 1, 305 F; 156/620, 621, 622, 624, DIG. 11, 74

[56] References Cited

U.S. PATENT DOCUMENTS

| | | | |
|---|---|---|---|
| 2,762,778 | 11/1956 | Gorter et al. | 252/62.51 X |
| 2,945,744 | 7/1960 | Knox | 252/62.51 X |
| 3,193,503 | 7/1965 | Smith | 252/62.56 X |
| 3,223,641 | 12/1965 | Lessoff et al. | 252/62.56 X |
| 3,305,301 | 2/1967 | Remeika | 252/62.61 X |
| 3,477,959 | 11/1969 | Colton | 156/606 |
| 3,484,376 | 12/1969 | Maurice et al. | 252/62.6 X |
| 3,486,937 | 12/1967 | Linares | 427/128 |
| 3,488,157 | 1/1970 | Koffer | 156/606 |
| 3,492,237 | 1/1970 | Schultz | 252/62.61 |
| 3,498,836 | 3/1970 | Gambino | 252/62.64 X |
| 3,630,912 | 12/1971 | Michael et al. | 252/62.6 X |

FOREIGN PATENT DOCUMENTS 2,427,944 10/1974 Germany ......................... 156/605

OTHER PUBLICATIONS

Kriger, E. M., Chemical Abstracts, vol. 76, 1972 p. 446, 20765a.
Shorina, L. L., Chemical Abstracts, vol. 84, 1976 p. 343, 35875a.
Moldoranu, Elena Chemical Abstracts, vol. 83, 1975 p. 763, 89985j.
Krizer, E. M., Chemical Abstracts, vol. 76, 1972, p. 375, 118127u.

Primary Examiner—Stanley S. Silverman
Attorney, Agent, or Firm—H. Fredrick Hamann; G. Donald Weber, Jr.; Robert Ochis

[57] ABSTRACT

A new magnetic microwave composite, a smooth monocrystalline substituted lithium ferrite ($Li_{1-x}Na_xFe_5O_8$) film on a monocrystalline magnesium oxide substrate is disclosed. Lithium ferrite films may be epitaxially grown on magnesium oxide substrates with excellent lattice matching by partial substitution of sodium for the lithium to increase the lattice constant of the lithium ferrite to match that of magnesium oxide.

8 Claims, 4 Drawing Figures

EPITAXIAL, SODIUM-SUBSTITUTED LITHIUM FERRITE FILMS

BACKGROUND OF THE INVENTION

1. Field of the Invention

This invention relates to the field of magnetic, microwave materials and more particularly to the field of epitaxial, thin film, magnetic, microwave materials.

2. Prior art

Lithium ferrite is recognized as a highly desirable microwave magnetic material chiefly because of its low linewidth and corresponding low loss at microwave frequencies. In addition, lithium ferrite has a high Curie temperature, high saturation magnetization and a substantially square hysteresis loop. Each of these characteristics contribute to the desirability and vast usefulness of lithium ferrite as a microwave material.

Prior art lithium ferrites have been available as bulk monocrystalline and polycrystalline material and as thin films formed by chemical vapor deposition (CVD) techniques. Flux grown bulk monocrystalline lithium ferrite often includes crystalline voids resulting from flux inclusions within the crystal. In addition, there is often a variation in the composition of the film from the inner or first grown portion of the crystal material and the outer or last grown portion of the crystal material as a result of segregation effects within the melt. Thus, such single crystalline bulk materials do not have uniform characteristics. Further, there are cutting and polishing problems which are well known in the art with respect to the obtaining of very thin films from bulk single crystals. Thicker films obtained from bulk crystals have the problem of void and the composition variation. With respect to the polycrystalline material, this material does not have the narrow ferromagnetic resonance linewidth of the single crystalline material and therefore is not as beneficial as single crystalline material in those applications which require narrow linewidths. CVD lithium ferrite films have been disposed on only a few substrate materials. Such films have been under significant strain due to lattice constant mismatch between the films and substrate. Unfortunately, since lithium ferrite is a magnetic material, strain in a film of lithium ferrite acts through the magnetostriction constant of the material to influence the properties of the strained sample and has the undesired effect of broadening the ferromagnetic resonance linewidth of the material. The broadening of the linewidth which results from extreme film tension partially negates the advantages of lithium ferrite as a magnetic microwave material.

Magnesium oxide has satisfactory characteristics for use as a microwave substrate, in that it does not significantly adversely affect the propagation of microwaves. Unfortunately, the relative lattice constants of lithium ferrite and magnesium oxide are such that lithium ferrite films grown by prior art techniques on a magnesium oxide substrate are under such tension that they crack. The usefulness of such lithium ferrite films for microwave applications is drastically reduced by the resulting cracks in the film. These cracks result in a non-uniform material having microwave characteristics which are significantly inferior to what they would be if the film were uncracked. Such inferiority results from the strain in the individual portions of the film which are bounded by cracks and by the discontinuities in the film which are created by the cracks.

In order to obtain the full benefits potentially available from use of lithium ferrite as a microwave material, unstrained epitaxial films disposed on non-magnetic substrates are needed.

SUMMARY OF THE INVENTION

This invention overcomes the disadvantages associated with prior art epitaxial lithium ferrite films by adjusting the lattice constant of the epitaxial film so that the film may be deposited on magnesium oxide substrates with a minimum of strain. The lattice constant of the lithium ferrite is increased by the partial substitution, in small quantities, of sodium for the lithium in the lithium ferrite. These lithium ferrite films are preferably grown by liquid phase epitaxial techniques in order that the composition of the film may be closely controlled.

DETAILED DESCRIPTION OF THE PREFERRED EMBODIMENT

Figure 1:
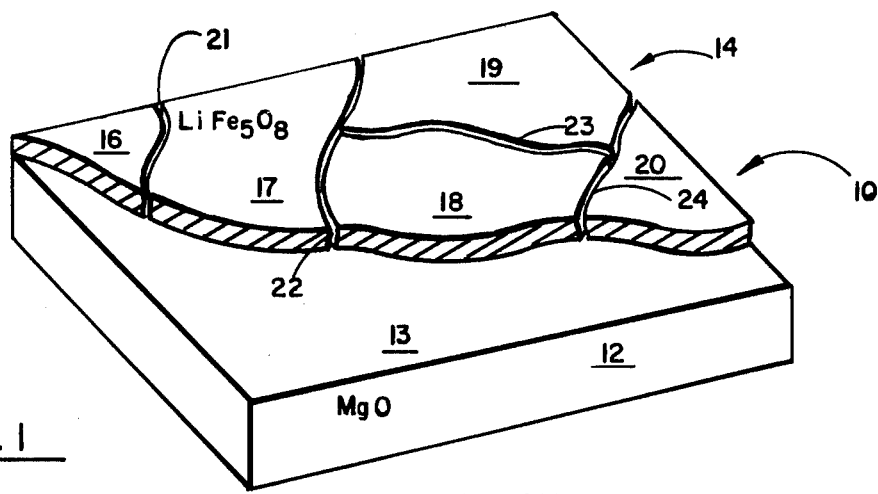
FIG. 1 is a perspective partially cutaway view of a prior art lithium ferrite film disposed on a magnesium oxide substrate.

FIG. 1 illustrates in partially cutaway perspective a prior art composite 10 comprising a magnesium oxide (MgO) substrate 12 having an epitaxial lithium ferrite ($LiFe_5O_8$) film 14 disposed on a surface 13. High tensile stress tension in the lithium ferrite film which results from a large lattice constant mismatch between the lithium ferrite film and the magnesium oxide substrate has cracked film 14 into a plurality of separate segments 16, 17, 18, 19 and 20. The individual segments 16–20 of the lithium ferrite film are separated from each other by cracks or crazes 21, 22, 23 and 24. Each of the cracks or crazes 21–24 creates a discontinuity in the lithium ferrite film 14 and results in a film having a reduced level of microwave performance over that which could be achieved with an uncrazed, unstrained film. The cracks 21–24 may be of varying width and thus represent voids of varying widths in the film.

Figure 2:
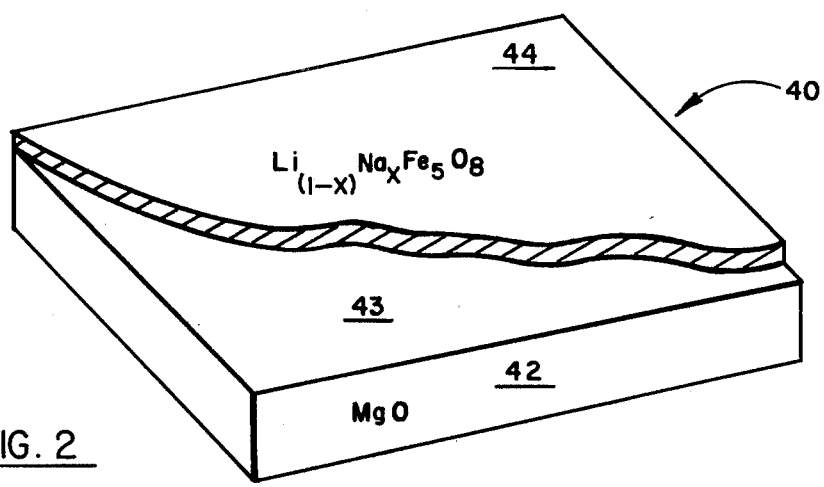
FIG. 2 is a perspective partially cutaway view of a lithium ferrite film in accordance with the invention disposed on a magnesium oxide substrate.

As illustrated in FIG. 2 a lithium ferrite/magnesium oxide composite 40 in accordance wih the invention comprises a magnesium oxide substrate 42 having as a lithium ferrite film 44 in which sodium has been partially substituted for the lithium disposed on a surface 43. The sodium partially substituted for the lithium increases the lattice constant of the lithium ferrite layer 44 to a value which matches the lithium ferrite crystal lattice to magnesium oxide lattice sufficiently closely to reduce the strain to acceptable levels. This results in a film having improved microwave characteristics and in the elimination of the cause (excessive tensile stress in the film) of the cracks or crazes 21–24 which are present in the prior art films 14 (FIG. 1).

Lithium ferrite and magnesium oxide each contain oxygen in a close-pack array. Because both materials contain close-packed oxygen lattices, the lattice structures of lithium ferrite and magnesium oxide are similar, although the lattice constant of lithium ferrite is 8.33 A and that of magnesium oxide is 4.21 A. Doubling the unit cell of the magnesium oxide provides an effective lattice parameter of 8.42 A for the magnesium oxide. Since the lithium ferrite lattice is somewhat smaller than the "doubled unit cell" of magnesium oxide, a pure lithium ferrite film is in tensile stress when disposed on a magnesium oxide substrate. The difference in lattice constants (8.42 A minus 8.33 A = 0.09 A) of 0.09 A induces sufficient tension in a lithium ferrite film to cause the cracking and crazing which occurs in prior art films as illustrated in FIG. 1.

In accordance with the invention a larger ion is substituted for a small portion of the lithium ($Li^+$) in the $LiFe_5O_8$. This increases the lattice constant of the lithium ferrite film in the vicinity of the locations in which the larger ion is substituted. This local microscopic expansion of the lattice of the lithium ferrite is sufficient to increase the average lattice constant such that the average unit cell dimensions for the lithium ferrite match the dimensions of the doubled magnesium oxide unit cell. This match minimizes any long range cumulative mismatch between the film and the substrate which consequently induces insufficient tension to crack the film 44.

Figure 3:
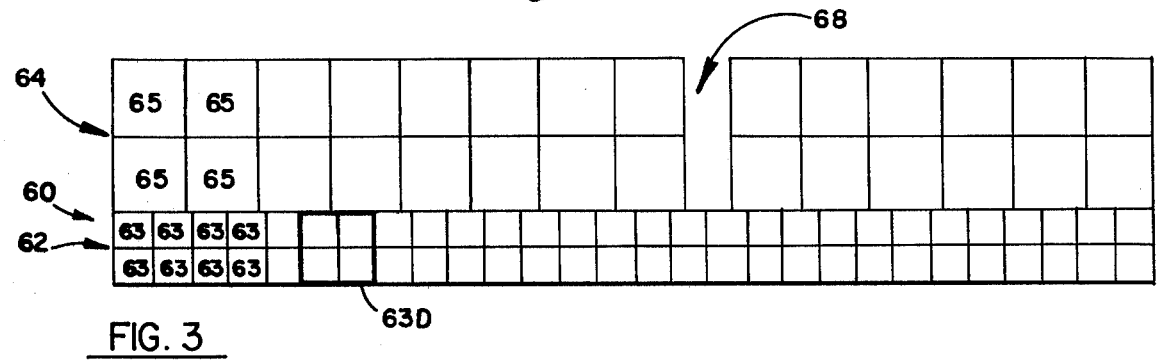
FIG. 3 is a simplified stylized illustration of the lattice mismatch between a prior art $LiFe_5O_8$ film and an MgO substrate, at the film-substrate interface.
Figure 4:
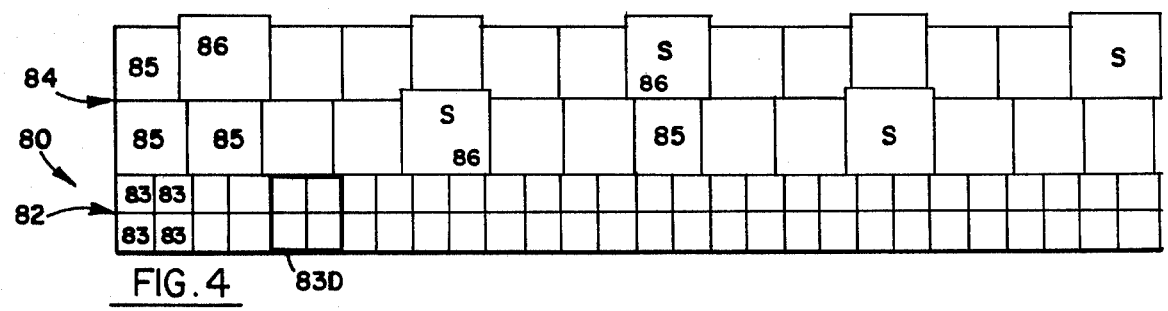
FIG. 4 is a simplified stylized illustration of the lattice constant match obtained by $Li_{1-x}Na_xFe_5O_8$ films in accordance with the invention which are disposed on MgO substrates, at the film-substrate interface.

The difference in the matching of a prior art lithium ferrite film unit cell with a magnesium oxide substrate and the matching of a film in accordance with the invention with a magnesium oxide substrate is illustrated in FIGS. 3 and 4. Both figures 3 and 4 are drastically simplified and are stylized. These figures are for illustrative purposes only. A composite 60 comprising a pure lithium ferrite film 64 epitaxially disposed on a magnesium oxide substrate 62 is illustrated in FIG. 3 in a vastly oversimplified presentation of the lattice constant mismatch problem in the region of the film-substrate interface. Magnesium oxide substrate 62 is made up of a vast number of crystallographic unit cells 63, while lithium ferrite film 64 is made up of a vast number of crystallographic unit cells 65. As has been discussed above, the lattice parameter of the lithium ferrite unit cell 65 is only slightly less than the lattice parameter of a "doubled" magnesium oxide unit cell 63D which actually contains 8 unit cells by virtue of a doubling of each dimension of the basic unit cell 63. Because the lattice constant of the lithium ferrite unit cell 65 is less that that of the double unit cell 63D of magnesium oxide, the misalignment between the edges of the unit cells of lithium ferrite film 64 and the unit cells of magnesium oxide film 62 become progressively greater as one progresses away from a unit cell of the film which has a cell boundary in alignment with a unit cell boundary of the substrate as shown by the right edge of FIG. 3. This effect is exaggerated in FIG. 3. The bonding forces which bind the epitaxial film to the substrate place the film in significant tension. Since the oxygen close-packed lattices are continuous across the interface the distortion shows up as defects, dislocations and strain. Very thin films can withstand extreme distortion without cracking. Because of the characteristics of these forces, unit cells will be distorted, but the crystal structure is not destroyed over segments of the crystal structure comprising many unit cells. However, as in the prior art composite 10 of FIG. 1 where the resulting tension is sufficient, a crack 68 (FIG. 3) will appear across the film similar to the cracks and craze marks 21-24 in the film 14 of FIG. 1. The cracks 68 relieve the tension which would otherwise result from the mismatch of the lattice constants of film 64 and substrate 62. Cracks 68 also result in discontinuities in the film. Cracks relieve stress in their immediate vicinity but the intact films remain strained albeit not to the breaking point.

In FIG. 4, a composite 80 in accordance with the invention is illustrated in a fashion similar to that in which the prior art composite is illustrated in FIG. 3. Composite 80 comprises a magnesium oxide substrate 82 and a film 84 of lithium ferrite in which sodium has been partially substituted for the lithium. As was the case with the prior art composite 60, the lattice constant of the majority of the lithium ferrite unit cells 85 is smaller than the lattice parameter of the double unit cell 83D of the magnesium oxide substrate. However as a result of the partial substitution of sodium for lithium, there are also unit cells 86 present in the film which have a lattice parameter which is larger than that of the double unit cell 83D of the substrate. These enlarged unit cells have been indicated in the figure by a S which was selected as an indication that the unit cell contains a substituted ion. Although substituted cells 86 are illustrated as having the dimensions of the unit cell expanded equally in all directions that is an oversimplification since there are four $Li^+$ ion per unit cell in $LiFe_5O_8$ and generally only one of these will be substituted for in substituted unit cells 86 (for small to moderate concentrations of sodium ions in the film). Because of the interspersal of the substituted unit cells 86 with the unsubstituted unit cells 85, there is insufficient long distance tensile stress within the lithium ferrite film 84 to induce cracking.

It will be appreciated, that there is a range of concentration for the substituted sodium which will result in craze-free films, although the tension (or compression) actually present in the film will depend on the quantity of substituted sodium and uniformity of dispersion of the substituted sodium ions.

The larger ion which is substituted for the $Li^+$ must have the same charge and a chemical behavior which is similar to that of lithium in order that it may serve to increase the lattice parameter of the lithium ferrite to obtain a match with the magnesium oxide substrate, but not degrade the magnesium properties of the lithium ferrite. The sodium ion ($Na^+$) fulfills these requirements. In octrahedral coordination, $Li^+$ has an ionic radius of 0.74 A and $Na^+$ has an ionic radius of 1.02 A so that even a small amount of substitution of sodium for the lithium has a significant expansive effect on the lattice parameter of the lithium ferrite film.

It is preferred to grow the lithium ferrite film of this invention by liquid phase epitaxy techniques, since such techniques when properly controlled yield films of accurately controlled composition having repeatable characteristics.

EXAMPLE 1

A liquid phase epitaxy melt was formed from ferric oxide ($Fe_2O_3$), lithium carbonate ($Li_2CO_3$) and sodium carbonate ($Na_2CO_3$) source powders in a molar ratio of 58.84 to 56.31 to 1. This melt was prepared in a $PbO/B_2O_3$ flux having a 50 to 1 PbO to $B_2O_3$ weight ratio. This melt had a 0.0178 sodium to lithium molar ratio. The components of the flux were thoroughly mixed in powder form and the mixture of powders was heated to 1100° C to form a uniform liquid melt. During the heating of the mixture to 1100° C the carbonates decompose to oxides with the result that the melt when uniform was composed solely of oxides. Once the melt was uniform, the melt was cooled to about 778° C to super saturate the solution. A magnesium oxide (MgO) substrate having the (111) crystallographic plane exposed as a deposition surface was lowered into the melt while the melt was maintained at 778° C. The substrate was rotated at 2 rpm for two hours. The substrate was then slowly removed from the melt. The resulting monocrystalline epitaxial film exhibited the typical red color of lithium ferrite and had a smooth, uncrazed surface in contrast to previously grown sodium-free lithium ferrite films which cracked due to excessive tension.

From atomic absorption analysis of this epitaxial film it was determined that the film had a sodium to lithium molar ratio of 0.024.

EXAMPLE 2

A second liquid phase epitaxy melt comprising ferric oxide, lithium carbonate and sodium carbonate in a molar ratio of 131.58 to 32.95 to 1 was prepared in a $PbO/B_2O_3$ having a PbO to $B_2O_3$ weight ratio of 50 to 1. This melt had a sodium to lithium molar ratio of 0.0304. This melt was prepared for deposition in the same fashion in which the melt of Example 1 was prepared. An magnesium aluminum spinel ($MgAl_2O_4$) substrate having the (111) crystallographic plane exposed for deposition was lowered into the melt and rotated at 21 rpm for approximately 60 minutes and then removed from the melt. The resulting epitaxial film had the characteristic red color of a lithium ferrite and was monocrystalline. However, the film was rough, in part, as a result of the retention of flux on the film after removal from the melt, and in part, as a result of facetted growth due to extreme compression in the growing film which resulted from a lattice mismatch between the lithium ferrite and the magnesium aluminum spinel substrate. The magnesium aluminum spinel has a lattice constant of 8.08 A which is 0.25 A smaller than that of unsubstituted lithium ferrite. As a result of the partial substitution of sodium for lithium, the lithium ferrite lattice constant is expanded as has been discussed. Consequently, a difference in lattice constants between the film and the substrate was even greater than 0.25 A. Consequently, the film was under extreme compression which caused the facetted growth. Compositional analysis of this film established a sodium to lithium molar ratio of 0.121 for this film.

EXAMPLE 3

A third liquid phase epitaxy melt comprising ferric oxide, lithium carbonate, and sodium carbonate in a molar ratio of 164.21 to 0.95 to 1 was prepared in another $PbO/B_2O_3$ flux having a PbO to $B_2O_3$ weight ratio of 50 to 1. This melt had a sodium to lithium molar ratio of 1.06. This melt was prepared for deposition in the same fashion as in Example 1. A magnesium oxide substrate having the (111) crystallographic plane exposed as a deposition surface was inserted into the melt. This substrate was rotated at 15 rpm for 2.5 hours at a deposition temperature of approximately 880° C. The resulting film had the characteristic red color of lithium ferrite, was monocrystalline, smooth and not cracked. Chemical analysis of this epitaxial film established a sodium to lithium molar ratio of 0.268 for this film.

Single crystal lithium ferrite films were also grown on (100) MgO. However, no chemical analysis of the resulting film was performed.

The molar ratio of sodium to lithium in the melt and in the resulting films for Examples 1 through 3 are tabulated in Table I.

Table I

| Example No. | Na/Li Molar Ratios | |
| --- | --- | --- |
| | Melt | Film |
| 1 | 0.0178 | 0.024 |
| 2 | 0.0304 | 0.121 |
| 3 | 1.06 | 0.268 |

The results tabulated in Table I establish that increasing the sodium to lithium molar ratio in the melt produces an increase in the sodium to lithium molar ratio of a craze-free lithium ferrite film. Thus, the tensile stress in an uncrazed smooth lithium ferrite epitaxial film can be controlled within the uncrazed stress range. Thus, high quality lithium ferrite epitaxial films disposed on magnesium oxide substrates with minimal stress have been produced which are suitable for microwave use.

The benefits of this invention have been discussed primarily in connection with the preferred embodiment whose prime application is to microwave uses, however, it will be understood that the epitaxial lithium ferrite films of this invention may be utilized at any frequency or in any system where their characteristics are beneficial. Further, although the expansion of the lattice constant of lithium ferrite has been discussed with respect to the preferred substrate material of magnesium oxide it will be understood that this lattice expansion technique can be utilized with other substrate materials which have larger lattice constants than pure lithium ferrite.

What is claimed is:

1. A composite comprising a monocrystalline substrate having a lattice constant which causes single crystalline lithium ferrite disposed thereon to crack, said substrate having epitaxially disposed thereon a crackfree monocrystalline layer of lithium ferrite having sodium substituted for a portion of the lithium, said film having sodium and lithium present in a molar ratio Na/Li within a range of about 0.024 to 0.268.

2. The composite recited in claim 1 wherein the substrate is MgO.

3. A composite comprising a monocrystalline MgO substrate having epitaxialy disposed thereon a monocrystalline layer of lithium ferrite having sodium substituted for a portion of the lithium wherein the film has sodium and lithium present in a molar ratio Na/Li within a range of about 0.024 to 0.268.

4. The composite recited in claim 3 wherein the film is disposed on the (111) crystallographic plane of the MgO.

5. The composite recited in claim 3 in which the film is disposed on a (100) crystallographic plane of the MgO.

6. The composite recited in claim 3 wherein said molar ratio is substantially 0.024.

7. The composite recited in claim 3 wherein the molar ratio is substantially 0.121.

8. The composite recited in claim 3 wherein the molar ratio is substantially 0.268.

* * * * *